United States Patent [19]

Spielberger

[11] Patent Number: 5,061,822
[45] Date of Patent: Oct. 29, 1991

[54] RADIAL SOLUTION TO CHIP CARRIER PITCH DEVIATION

[75] Inventor: Richard K. Spielberger, Maple Grove, Minn.

[73] Assignee: Honeywell Inc., Minneapolis, Minn.

[21] Appl. No.: 501,387

[22] Filed: Mar. 23, 1990

Related U.S. Application Data

[63] Continuation of Ser. No. 243,412, Sep. 12, 1988, abandoned.

[51] Int. Cl.[5] .............................................. H01L 23/13
[52] U.S. Cl. ..................................... 174/52.4; 357/70; 361/404
[58] Field of Search ........................ 174/52.4; 357/70; 361/404, 405, 406; 439/83

[56] References Cited

U.S. PATENT DOCUMENTS

| | | | |
|---|---|---|---|
| 3,405,224 | 10/1968 | Yawata et al. | 174/52.4 X |
| 3,469,684 | 9/1969 | Keady et al. | 174/52.4 X |
| 3,544,857 | 12/1970 | Byrne et al. | 174/52.4 X |
| 3,636,235 | 1/1972 | Williams | 437/214 |
| 3,659,035 | 4/1972 | Planzo | 174/52.4 X |
| 3,673,309 | 6/1972 | Dalmasso et al. | 174/52.2 |
| 3,698,074 | 10/1972 | Helda et al. | 437/207 |
| 3,700,788 | 10/1972 | Spurck | 174/52.4 |
| 3,778,887 | 12/1973 | Suzuki et al. | 357/70 X |
| 3,801,728 | 4/1974 | Gallo, Jr. et al. | 174/52.4 |
| 3,959,579 | 5/1976 | Johnson | 174/68.5 |
| 4,336,342 | 12/1982 | Breedlove | 523/144 |
| 4,513,355 | 4/1985 | Schroeder et al. | 361/403 |
| 4,523,218 | 6/1985 | Kato | 357/70 |
| 4,549,036 | 10/1985 | Reichbach | 174/52.2 |

Primary Examiner—Leo P. Picard
Assistant Examiner—David A. Tone
Attorney, Agent, or Firm—John P. Sumner; Gregory A. Bruns

[57] ABSTRACT

Disclosed is a radial solution to integrated circuit chip carrier pitch deviation. The invention comprises a chip carrier comprising a carrier body with a plurality of fine pitch metalizations. Each of the metalizations includes an axis with an extension line that intersects a point common to all axes so that each metalization may be functionally utilized independent of carrier body shrinkage tolerances.

13 Claims, 1 Drawing Sheet

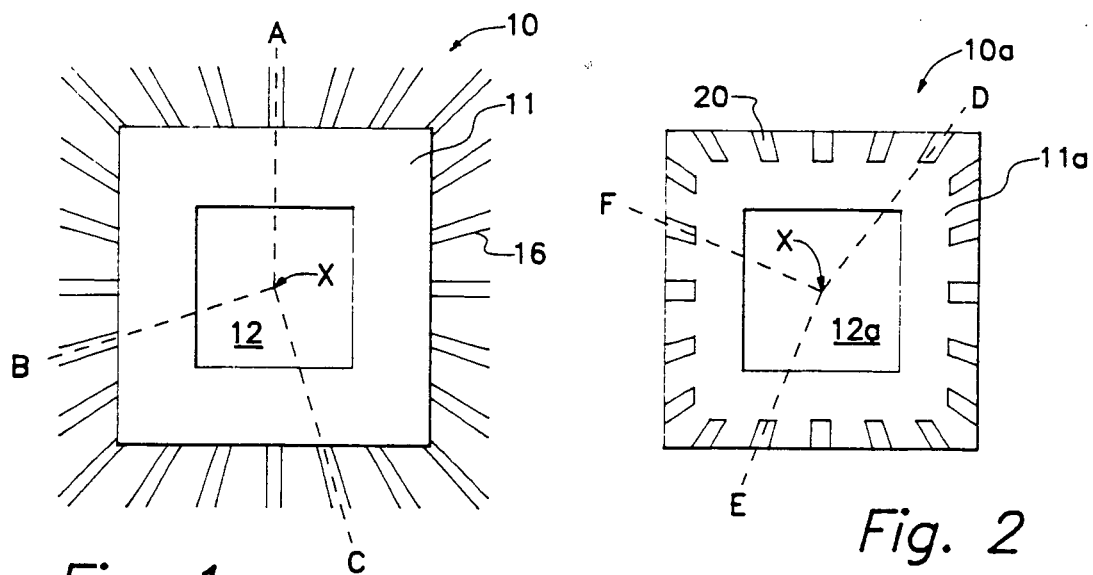
Fig. 1
Fig. 2
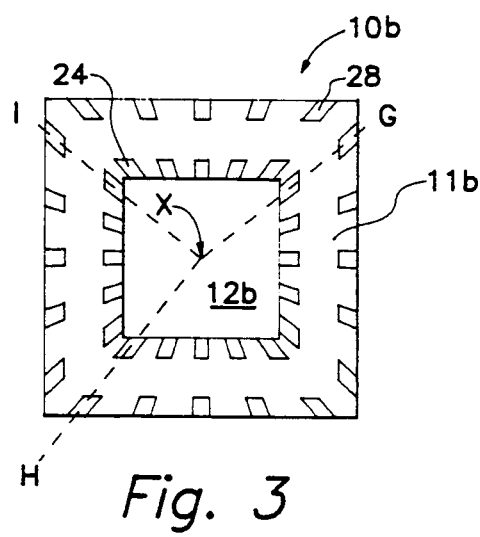
Fig. 3
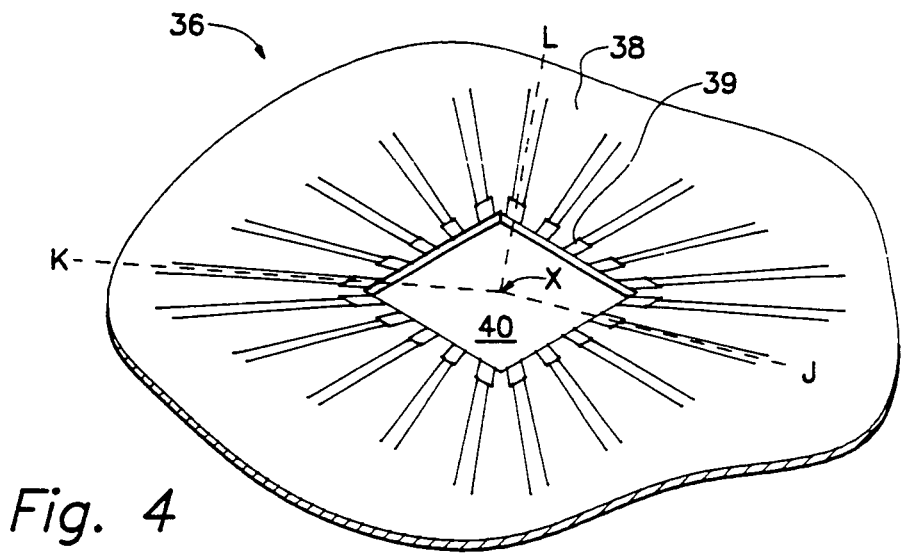
Fig. 4

RADIAL SOLUTION TO CHIP CARRIER PITCH DEVIATION

This is a continuation of application Ser. No. 07/243,412 filed Sept. 12, 1988, now abandoned.

FIELD OF THE INVENTION

The present invention relates generally to the field of integrated circuitry and more specifically to the construction of integrated circuit chip carriers.

BACKGROUND OF THE INVENTION

Within the field of electronic integrated circuitry, there exists a need for accurate positioning and bonding of circuit components to ensure circuit integrity and proper operation. One example of this accuracy requirement involves integrated circuit chips which must be accurately located within and bonded to ceramic chip carriers. The ceramic chip carriers typically must then be accurately located within and bonded to next-level-of-packaging components, such as printed circuit boards.

Typical electronic chips and chip carriers may include hundreds of bonding points which require considerable alignment accuracy to be functional. In many cases, the positioning and bonding of these chips and chip carriers is hampered by next-level-of-packaging components which have misaligned bonding pads or leads. Frequently such misalignment is caused by the shrinkage of ceramic carriers during manufacture. Indeed, each ceramic chip carrier may shrink on the average of 15% of total size during the firing portion of manufacture. Such shrinkage is well known in the field of chip carrier production, and shrinkage tolerance specifications are generally specified. Nevertheless, a sizable number of ceramic chip carriers experience unacceptably large shrinkage distortions and must be rejected. These rejections result in substantial inefficiencies and expense due to product loss and wasted production time. Moreover, with the development of higher density and finer pitch lead environments in electronic circuitry, there is an enhanced need for a solution to this packaging problem.

What has been needed, therefore, is a system for arranging bonding points between integrated circuit components for functional use independent of carrier shrinkage tolerances. What has been further needed is a system for arranging bonding points on an integrated circuit board footprint for functional receipt and bonding of electronic components independent of component or circuit board shrinkage tolerances.

What has been further needed is a method to very precisely position and bond integrated circuit components with next-level-of-packaging independent of component or package shrinkage tolerances.

SUMMARY OF THE INVENTION

The present invention is a system for accurately positioning and bonding integrated circuit components with next-level-of-packaging independent of component or package shrinkage tolerances. The system comprises a chip carrier having a carrier body and a plurality of fine pitched metalization means. Each metalization means includes an axis having an extension line which intersects a point common to all axes so that each metalization means may be functionally utilized independent of carrier shrinkage tolerances.

BRIEF DESCRIPTION OF THE DRAWINGS

FIG. 1 is a top plan view of a leaded chip carrier constructed according to the present invention.

FIG. 2 is a top plan view of a leadless chip carrier constructed according to the present invention.

FIG. 3 is a top plan view of a leadless chip carrier having first interface metalization means for interfacing with an integrated circuit chip and second interface metalization means for interfacing with a next level of packaging.

FIG. 4 is a fragmentary perspective view of a circuit board having radially oriented metalization means arranged for receipt of a chip carrier constructed according to the present invention.

DETAILED DESCRIPTION WITH PREFERRED EMBODIMENTS

Detailed embodiments of the present invention are disclosed. It is to be understood, however, that the disclosed embodiments are merely exemplary of the invention, which may be embodied in various forms. Therefore, specific structural and functional details disclosed are not to be interpreted as limiting, but rather as a representative basis for teaching one skilled in the art to variously employ the present invention in virtually any appropriately detailed system or structure. It will be understood that in some instances relative material thicknesses and relative component sizes may be shown exaggerated, to facilitate an understanding of the invention.

Referring to FIG. 1, a top plan view of a representative integrated circuit chip carrier 10 is shown. Chip carrier 10 may be constructed in various shapes to accommodate one or more integrated circuit chips (not shown). Chip carrier 10 is typically constructed of a material which experiences substantial shrinkage during manufacture. A ceramic material is commonly used to produce chip carrier 10. As constructed, chip carrier 10 comprises a carrier body 11 which is preferably designed to receive and hold an integrated circuit chip in the centrally located chip carrying area 12. Although chip carrier 10 comprises a carrier body 11 and a chip carrying area 12, which may be recessed, chip carrier 10 may be constructed using various elevational configurations. Various conductive means may be employed to provide a path of conductivity between an integrated circuit chip located in area 12 and interface metalization means, shown in FIG. 1 as leads 16. Leads 16 provide electrically conductive interfaces between the integrated circuit chip in area 12 and a next-level-of-packaging external to chip carrier 10.

Distortions and shrinkage of chip carriers frequently causes misalignment in prior art devices between integrated circuit chip leads and interface metalizations on the chip carrier. Therefore, the orientation of leads 16 on chip carrier 10 must compensate for chip carrier 10 shrinkage during manufacture. Shrinkage of ceramic chip carrier 10 will occur generally symmetrically about point X, a point common to all lead axes. Accordingly, leads 16 are constructed and arranged so that each lead has a longitudinal axis with an extension line which intersects a point common to all axes, e.g. point X or a similar region in area 12. Exemplary axis extensions are shown in relation to leads A, B, and C in FIG. 1; D, E, and F in FIG. 2; G, H, and I in FIG. 3; and J, K, and L in FIG. 4. Therefore, any ceramic shrinkage will be readily predictable and will occur along an existing interface metalization means axis rather than in a more irregular manner with respect to the metalization means. The preferred pure radial orientation of metalization means 16 thus compensates for ceramic carrier 10 shrinkage and allows functional use of chip carrier 10 independent of carrier shrinkage tolerances. Accordingly, preferred radial orientation of interface metalization means 16 permits recovery and use of ceramic chip carriers which would have previously been discarded as unusable.

FIG. 2 illustrates a chip carrier 10a comprising a carrier body 11a and a chip carrying area 12a. Interface metalization means is also provided comprising a plurality of bonding pads 20. Bonding pads 20 are oriented on chip carrier 10a in substantially the same manner as leads 16, shown in FIG. 1. Accordingly, bonding pads 20 each include a longitudinal axis having an extension line which intersects a point X or a similar region in area 12a that is common to all axes. Therefore, the interface metalization means illustrated in FIG. 2 is analogous to that shown in FIG. 1. Specifically, bonding pads 20 are constructed and arranged and comprise means for functional use independent of carrier shrinkage tolerances.

FIG. 3 is a top plan view of a chip carrier 10b having a carrier body 11b with a chip carrying area 12b. As illustrated, chip carrier 10b of FIG. 3 comprises first interface metalization means 24 for interfacing with an integrated circuit chip and second interface metalization means 28 for interfacing with a next-level-of-packaging component. Various conductive means may be employed to provide a path of conductivity between an integrated circuit chip located in area 12b and first interface metalization means 24. Similarly, various conductive means may be employed to provide a path of conductivity between first interface metalization means 24 and second interface metalization means 28. Further, first interface metalization means 24 and second interface metalization means 28 need not be located on identical sides of chip carrier 10, although such a configuration is preferred.

FIGS. 1 and 2 illustrate the optional use of either leads or pads to comprise metalization means, but in FIG. 3 the concept is further developed. First interface metalization means 24 and second interface metalization means 28 each comprise a plurality of metalizations which are constructed and arranged in a radial orientation around a central location, such as point X or chip carrying area 12b, so as to be substantially independent of carrier shrinking tolerances. The orientation of each of the first and second interface metalization means around central point X provides novel advantages described above in relation to FIGS. 1 and 2. However, the additional alignment of both the first and second interface metalization means with respect to a single point such as X provides further assurance of packaging utility independent of chip carrier 10b material shrinkage. It is to be appreciated that either first or second interface metalization means may comprise metalized leads, bonding pads, or similarly oriented electrically conductive paths.

Yet another aspect of the packaging problems associated with manufacturing shrinkage is the positioning and bonding of components onto printed circuit boards. FIG. 4 illustrates a representative portion of a printed circuit board 36 constructed and arranged to achieve the advantages of the present invention. Circuit board 36 comprises a circuit board member 38 and a plurality of bonding locations illustrated as bonding pads 39. Bonding pads 39 on circuit board member 38 each include a longitudinal axis with an extension line that intersects a point X common all axes. Point X is thus located in a central receiving area 40 which is constructed and arranged for receipt of chip carriers such as representative chip carriers 10, 10a, and 10b, shown in FIGS. 1-3. Although circuit board 36 comprises a circuit board member 38 having a recessed central receiving area 40, circuit board 36 may be constructed using different elevational configurations. However, as shown in FIG. 4, the superior orientation of bonding pads 39 solves the pitch deviation problem and permits functional use of circuit board member 38 independent of most shrinkage phenomena which have heretofore rendered circuit boards unusable.

A method of very precisely packaging integrated circuit components with next-level-of packaging independent of component or package shrinkage tolerances may also be implemented according to this invention. A preferred method includes the step of arranging a carrier body for receipt of a semiconductor chip. Then a plurality of fine pitch metalization means is configured on the carrier body for electrically interconnecting the carrier body with the semiconductor chip for functional use independent of carrier body shrinkage. As previously explained with respect to chip carrier 10, this method permits recovery and use of chip carriers which would have been previously discarded as unusable. The method preferably further comprises the step of locating the metalization means so that each conductive metalization means comprises an axis with an extension line which intersects a point common to all axes.

It is to be understood that while certain embodiments of the present invention have been illustrated and described, the invention is not to be limited to the specific forms or arrangements of parts described and shown above, since others skilled in the art may devise other embodiments still within the limits of the claims.

What is claimed is:

1. A leaded chip carrier comprising:
   a) a carrier body; and
   b) a plurality of fine pitch leads, each lead having a longitudinal axis with an extension line which intersects a point common to all axes so that each lead is functional independent of carrier body shrinkage tolerances.

2. A chip carrier comprising:
   a) a carrier body;
   b) first interface metalization means for interfacing with an integrated circuit chip; and
   c) second interface metalization means for interfacing with a next-level-of-packaging;
   d) the first and second interface metalization means each comprising a plurality of metalizations which are constructed and arranged in a radial orientation around a central location for an integrated circuit chip so as to be substantially independent of carrier body shrinkage tolerances.

3. A chip carrier comprising:
   a) a carrier body;
   b) a plurality of fine pitch leads for electrically interconnecting the carrier body with a semiconductor chip, each of the fine pitch leads having an axis with an extension line which intersects a point common to all axes, each of the fine pitch leads pivoting functional use independent of carrier body shrinkage tolerances.

4. A shrinkage tolerant semiconductor chip carrying assembly comprising:
   a) a chip carrier constructed and arranged for directly interfacing with a printed circuit board next-level-of-packaging, said chip carrier comprising a plurality of radially oriented metalization pads for interfacing with metalization elements on a printed circuit board next-level-packaging; and
   b) a printed circuit board member comprising a plurality of radially oriented metalization elements arranged on the printed circuit board member for maintaining a substantially aligned relation between the metalization pads and the metalization elements in order to facilitate electrical interconnection of the printed circuit board member with the chip carrier substantially independent of chip carrier shrinkage.

5. A chip carrier assembly comprising:
   a) a chip carrier having four substantially perpendicular side edges, a first surface configured for interfacing with a semiconductor chip, and a second surface configured for interfacing with a circuit board next-level-of-packaging;
   b) a plurality of radially oriented metalized pads attached to the second surface of the chip carrier for interfacing with metalized elements on a circuit board next-level-of-packaging so that the interface between the chip carrier and the circuit board next-level-of-packaging is substantially independent of chip carrier shrinkage; and
   c) a circuit board next-level-of-packaging interfaced with the radially oriented metalized pads attached to the second surface of the chip carrier.

6. A chip carrier according to claim 5 wherein each of the radially oriented metalized pads comprises an axis which intersects a point common to all of the axes.

7. A circuit board assembly, comprising:
   a) a circuit board member; and
   b) a plurality of metalization means arranged on the circuit board member for electrically interconnecting the circuit board member with a chip carrier, each metalization means comprising an axis with an extension line that intersects a point common to all axes, each metalization means further comprising means for providing functional interconnection with the chip carrier independent of chip carrier shrinkage.

8. A circuit board according to claim 7 wherein the metalization means comprises bonding pads.

9. A method of interconnecting a chip carrier to a circuit board next-level-of-packaging comprising the steps of:
   a) arranging a chip carrier for receipt of a semiconductor chip;
   b) configuring a plurality of radially oriented metalized elements on the chip carrier for interfacing with metalized elements in a circuit board next-level-of-packaging so that the interface to the circuit board next-level-of-packaging is substantially independent of chip carrier shrinkage;
   c) substantially aligning the metalized elements on the chip carrier over the metalized elements on the circuit board next-level-of-packaging; and
   d) interconnecting the substantially aligned elements.

10. The method according to claim 9 comprising the step of locating the radially oriented metalized elements on the chip carrier so that each of the radially oriented metalized elements comprises an axis with an extension line which intersects a point common to all axes.

11. The method according to claim 9 comprising the step of locating metalized elements on the circuit board next-level-of-packaging so that they are radially oriented and comprise an axis with an extension line which intersects a point common to all axes.

12. A method of packaging semiconductor chips comprising the steps of:
   a) arranging a chip carrier for receipt of a semiconductor chip;
   b) configuring a plurality of metalized pads on a semiconductor chip for interfacing with metalized elements on the chip carrier;
   c) configuring a plurality of radially oriented metalized elements on the chip carrier for interconnecting with the metalized pads on the semiconductor chip for functional use independent of chip carrier shrinkage;
   d) substantially aligning the metalized pads on the semiconductor chip over the metalized elements on the chip carrier; and
   e) interconnecting the substantially aligned pads and elements.

13. The method according to claim 12 comprising the step of locating the metalized elements on the chip carrier so that each of the metalized elements comprises an axis with an extension line which intersects a point common to all axes.

* * * * *

UNITED STATES PATENT AND TRADEMARK OFFICE
CERTIFICATE OF CORRECTION

PATENT NO. : 5,061,822
DATED : October 29, 1991
INVENTOR(S) : RICHARD K. SPIELBERGER It is certified that error appears in the above-identified patent and that said Letters Patent is hereby corrected as shown below:

Column 4, line, 67, cancel "pivoting" and substitute --providing--.

Column 5, line 8, cancel "next-level-packaging" and substitute --next-level-of-packaging--.

Signed and Sealed this

Sixteenth Day of March, 1993

Attest:

STEPHEN G. KUNIN

Attesting Officer

Acting Commissioner of Patents and Trademarks